United States Patent [19]

Lou

[11] 4,068,140

[45] Jan. 10, 1978

[54] MOS SOURCE FOLLOWER CIRCUIT

[75] Inventor: Perry W. Lou, Houston, Tex.

[73] Assignee: Texas Instruments Incorporated, Dallas, Tex.

[21] Appl. No.: 754,377

[22] Filed: Dec. 27, 1976

[51] Int. Cl.$^2$ .......................... H03K 3/26; H03F 3/16
[52] U.S. Cl. .............................. 307/304; 307/DIG. 1;
 330/288
[58] Field of Search ................. 330/35; 307/205, 251,
 307/279, 304, 229, DIG. 1

[56] References Cited

U.S. PATENT DOCUMENTS

| 3,601,712 | 8/1971 | Elazar | 330/35 |
| 3,700,981 | 10/1972 | Masuhara et al. | 307/205 |
| 3,872,390 | 3/1975 | Nash | 330/35 |

OTHER PUBLICATIONS

Proceeding of the IEEE, Jan. 1966, p. 66.

*Primary Examiner*—Stanley D. Miller, Jr.
*Assistant Examiner*—B. P. Davis
*Attorney, Agent, or Firm*—James T. Comfort; John G. Graham

[57] ABSTRACT

A source follower circuit which exhibits essentially zero input to output voltage drop and very low capacitive loading on the input. A current mirror arrangement is used. The input is connected to the gate of a depletion mode transistor which is connected in series with an enhancement mode device. The gate of the enhancement device is biased by a series circuit having a depletion device with gate shorted to source and an enhancement device with gate shorted to drain.

11 Claims, 1 Drawing Figure

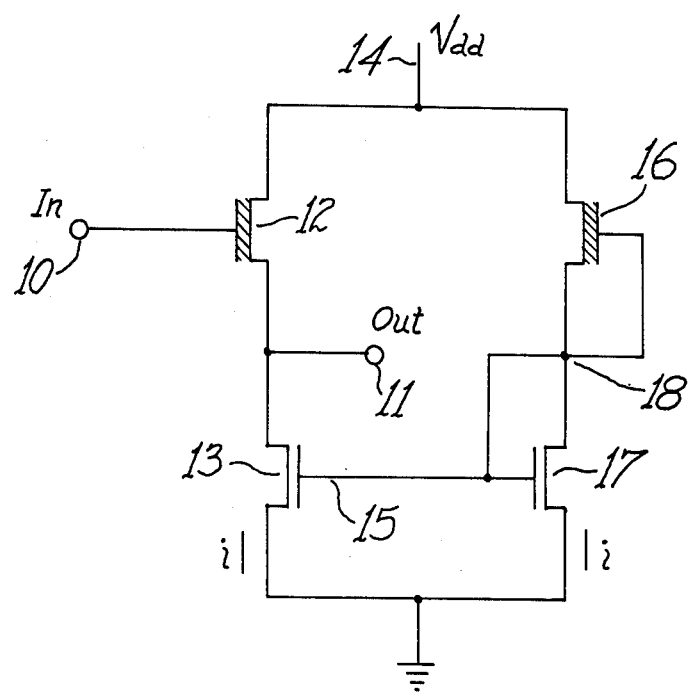

MOS SOURCE FOLLOWER CIRCUIT

BACKGROUND OF THE INVENTION

This invention relates to MOS circuits and more particularly to a source follower circuit which exhibits low input capacitance and low voltage drop from input to output.

In MOS integrated circuits there are many situations where a circuit node should be isolated from output loading. That is, a capacitive load would be detrimental to the circuit operation at this node. Likewise a load which conducts current, or which would feed back a voltage would be undesirable. A so-called "source follower" circuit has long been used in these applications, but still exhibits some capacitive loading.

It is the principal object of this invention to provide an MOS circuit which exhibits essentially zero voltage change from input to output and which exhibits substantially lower capacitive loading on the input. Another object is to provide an improved source follower circuit using MOS transistors.

SUMMARY OF THE INVENTION

In accordance with an embodiment of the invention, a source follower circuit is provided by a circuit arrangement with includes first and second series circuits, both series circuits having a depletion mode device and an enchancement mode device connected in series from a voltage supply to ground. The circuit input is the gate of the depletion mode transistor in the first series circuit, and the circuit output is a node between the two transistors in the first series circuit. The enchancement device of the first is biased by a current mirroring technique using the second series circuit where the depletion device has its gate shorted to source and the enchancement device has its gate shorted to drain. The two depletion devices are exactly the same size and shape, and the enchancement devices are the same size and shape as one another (or same ratios).

THE DRAWING

The novel features believed characteristic of the invention are set forth in the appended claims. The invention itself, however, as well as other features and advantages thereof, may best be understood by reference to the following detailed description of an illustrative embodiment, when read in conjuction with the accompanying drawing, wherein:

The FIGURE is an electrical schematic diagram of a source follower circuit according to the invention.

DETAILED DESCRIPTION OF ILLUSTRATIVE EMBODIMENT

With reference to the FIGURE, a source follower circuit according to the invention comprises an input terminal 10 and an output terminal 11 which are, respectively, the gate and source of a depletion mode transistor 12. The object is that the voltage on the output terminal 11 be the same as the voltage on the input terminal 10. The source-drain path of the depletion mode transistor 12 is connected in series with the source-drain path of an enhancement mode transistor 13 and this first series circuit is connected between a −Vdd voltage supply 14 and ground or Vss. Typically −Vdd is about −9v. dc. The gate 15 of the transistor 13 is biased by a current mirror arrangement which includes a second series circuit having a depletion mode transistor 16 and an enhancement mode transistor 17, these devices being connected in series between the −Vdd supply 14 and ground. The depletion device 16 has its gate shorted to its source at node 18 and thus generally functions as a constant current device. The enchancment device 17 has its gate shorted to its drain at the node 18 and tends to be in its saturation region with a constant current determined by the transistor 16. Saturation occurs when Vgs − Vt <Vds, generally.

The depletion device will have a given current $i$ flowing through it, as determined by its size and shape as well as process parameters. Since the transistor 17 is connected in series with the transistor 16, and the loading by the gate 15 is essentially zero, then the current through the transistor 17 must be the same current $i$. Since the transistors 13 and 17 are exactly the same size and shape, are very close to one another on an integrated circuit chip, and made by the same process at the same time, they are identical. Thus, because their gate voltages are the same, the currents through their source-drain paths must be the same, if transistor 13 is also in saturation, and it is because the voltage node 15 or Vgs minus Vt is less than Vds. Therefore, the current $i$ flows in the first series circuit. Assuming no appreciable loading on the output terminal 11, the current $i$ must also flow in the depletion mode device 12. Again, since the depletion mode transistors 12 and 16 are of the same size and shape, are close to one another on an integrated circuit chip, and are made by the same process at the same time, they are identical. Now, due to the fact that the current through the devices is the same, then their voltages must be the same; since the gate of the transistor 16 is connected to its source its gate voltage will equal its source voltage. Therefore, the source voltage of the transistor 12 will equal its gate voltage, which is the desired condition.

The circuit of the invention functions more nearly the ideal Vo = Vin line when the input voltage is near the Vref voltage or voltage on the node 18. So, when the operating range is known, Vref is selected to be the center of this range. When the input voltage is near zero, an offset voltage is introduced.

The same principles above described will apply if the transistors 12 and 13 are not the same size as the corresponding transistor 16 and 17, but have the same ratio of device sizes. That is, the transistors 12 and 13 could be 0.5/0.3 and 0.3/0.3 measured as channel W/L or width/length in mils, while the transistors 16 and 17 are 0.5/2.0 and 0.3/2.0, respectively. Thus, the widths should be the same for transistors 12 and 16, and for transistors 13 and 17; the ratio of W/L should be the same between transistors 12 and 13 as between transistors 16 and 17.

While this invention has been described with reference to an illustrative embodiment, this description is not meant up to be construed in a limiting sense. Various modifications of the illustrative embodiment, as well as other embodiments of the invention, will be apparent to persons skilled in the art upon reference to this desciption. It is therefore, contemplated that the appended claims will cover any such modifications or embodiments as fall within the true scope of the invention.

What is claimed is:

1. A source follower circuit comprising: first and second depletion mode MOS transistors; first and second enhancement mode MOS transistors; each transistor having a source, a drain and a gate; the ratios of channel width to length of the first enhancement and first depletion mode transistors being the same; the ratios of channel width to length of the second enhancement and second depletion mode transistors being the same; means connecting the source to drain paths of the first depletion mode and first enhancement mode transistors in series with one another to form a first series circuit; means connecting the first series circuit between a voltage supply and a reference potential; means connecting the source to drain paths of the second depletion mode and second enhancement mode transistors in series with one another to form a second series circuit; means connecting the second series circuit between said voltage supply and reference potential; means shorting the gate of the second depletion mode transistor to its source, means shorting the gate of the second enhancement mode transistor to its drain; means connecting the gates of first and second enhancement mode transistors; means for applying an input voltage to the gate of the first depletion mode transistor; the source of the first depletion mode transistor being the output of the circuit.

2. A circuit according to claim 1 wherein the sources of the first and second enhancement mode transistors are connected to reference potential.

3. A circuit according to claim 2 wherein the drains of the first and second depletion mode transistors are connected to the same voltage supply.

4. A circuit according to claim 3 wherein the source of the second depletion mode transistor is connected to the drain of the second enhancement mode transistor.

5. A source follower circuit comprising: first and second depletion mode MOS transistors identical in size and shape; first and second enhancement mode MOS transistors identical in size and shape; each transistor having a source, a drain and a gate; means connecting the source to drain paths of the first depletion mode and first enhancement mode transistors in series between a voltage supply and a reference potential; means connecting the source to drain paths of the second depletion mode and second enhancement mode transistors in series between a voltage supply and reference potential; the sources of the first and second enhancement mode transistors being connected to reference potential; means shorting the gate of the second depletion mode transistor to its source; means shorting the gate of the second enhancement mode transistor to its drain; means connecting the gates of first and second enhancement mode transistors; means fo applying an input voltage to the gate of the first depletion mode transistor; the source of the first depletion mode transistor being the output of the circuit; the source of the first depletion mode transistor being directly connected to the drain of the first enhancement mode transistor.

6. A circuit according to claim 5 wherein the output of the circuit exhibits negligible loading.

7. A source follower circuit comprising: first and second depletion mode MOS transistors; first and second enhancement mode MOS transistors; each transistor having a source, a drain and a gate; means connecting the source to drain paths of the first depletion mode and first enhancement mode transistors in series with one another to form a first series circuit; means connecting the first series circuit between first and second terminals; means connecting the source to drain paths of the second depletion mode and second enhancement mode transistors in series with one another to form a second series circuit; means connecting the second series circuit between the first and second terminals; means for applying a voltage supply across the first and second terminals; means shorting the gate of the second depletion mode transistor to its source; means shorting the gate of the second enhancement mode transistor to its drain; means connecting the gates of first and second enhancement mode transistors; means for applying an input voltage to the gate of the first depletion mode transistor; the source of the first depletion mode transistor being the output of the circuit.

8. A circuit according to claim 7 wherein the channel widths of the first and second depletion mode transistors are the same, the channel widths of the first and second enhancement mode transistors are the same, the channel lengths of the first depletion mode and first enhancement mode transistors are the same.

9. A circuit according to claim 8 wherein the source of the second depletion mode transistor is connected to the drain of the second enhancement mode transistor.

10. A source follower circuit comprising: first and second depletion mode MOS transistors; first and second enhancement mode MOS transistors; each transistor having a source, a drain and a gate; the channel widths of the first and second depletion mode transistors being the same, the channel widths of the first and second enhancement mode transistors being the same, the channel lengths of the first depletion mode and first enhancement mode transistors being the same; means connecting the source to drain paths of the first depletion mode and first enhancement mode transistors in series between first and second terminals; means connecting the source to drain paths of the second depletion mode and second enhancement mode transistors in series between the first and second terminals; means for applying a voltage supply across the first and second terminals; means shorting the gate of the second depletion mode transistor to its source; means shorting the gate of the second enhancement mode transistor to its drain; means connecting the second depletion mode transistor being connected to the drain of the second enhancement mode transistor; the source of the first depletion mode transistor being directly connected to the drain of the first enhancement mode transistor; means for applying an input voltage to the gate of the first depletion mode transistor; the source of the first depletion mode transistor being the output of the circuit.

11. A circuit according to claim 7 wherein: the ratios of channel width to length of the first enhancement and first depletion mode transistors are the same; the ratios of channel width to length of the second enhancement and second depletion mode transistors are the same.

* * * * *